United States Patent
Bartholomew

(10) Patent No.: US 7,135,933 B2
(45) Date of Patent: Nov. 14, 2006

(54) SYSTEM FOR ADJUSTING FREQUENCY OF ELECTRICAL OUTPUT PULSES DERIVED FROM AN OSCILLATOR

(75) Inventor: David B. Bartholomew, Springville, UT (US)

(73) Assignee: IntelliServ, Inc., Provo, UT (US)

( * ) Notice: Subject to any disclaimer, the term of this patent is extended or adjusted under 35 U.S.C. 154(b) by 47 days.

(21) Appl. No.: 10/711,648

(22) Filed: Sep. 29, 2004

(65) Prior Publication Data

US 2006/0071724 A1 Apr. 6, 2006

(51) Int. Cl.
*H03L 7/085* (2006.01)
*H03L 7/099* (2006.01)

(52) U.S. Cl. ........................ 331/1 A; 331/179; 327/105

(58) Field of Classification Search ................ 331/1 A, 331/74, 177 R, 179; 327/105–107; 368/155–159
See application file for complete search history.

(56) References Cited

U.S. PATENT DOCUMENTS

| | | | |
|---|---|---|---|
| 2,414,719 A | | 1/1947 | Cloud |
| 3,518,608 A | | 6/1970 | Papadopoulos |
| 4,577,163 A | * | 3/1986 | Culp ........................ 331/1 A |
| 4,739,325 A | | 4/1988 | MacLeod |
| 4,788,544 A | | 11/1988 | Howard |
| 4,791,378 A | * | 12/1988 | Waltham .................... 327/156 |
| 4,872,765 A | | 10/1989 | Schodowski |
| 5,053,982 A | * | 10/1991 | McCune, Jr. ............... 708/276 |
| 6,012,015 A | | 1/2000 | Tubel |
| 6,252,518 B1 | | 6/2001 | Laborde |
| 6,392,317 B1 | | 5/2002 | Hall et al. |
| 6,400,646 B1 | | 6/2002 | Shah et al. |
| 6,424,595 B1 | | 7/2002 | Chenin |
| 6,439,046 B1 | | 8/2002 | Kruspe et al. |
| 6,614,718 B1 | | 9/2003 | Cecconi et al. |
| 6,641,434 B1 | | 11/2003 | Boyle et al. |
| 6,670,880 B1 | | 12/2003 | Hall et al. |
| 6,666,396 B1 | | 2/2004 | Floerke et al. |
| 6,717,501 B1 | | 4/2004 | Hall et al. |
| 6,799,632 B1 | | 10/2004 | Hall et al. |
| 6,821,147 B1 | | 11/2004 | Hall et al. |
| 6,830,467 B1 | | 12/2004 | Hall et al. |
| 6,844,498 B1 | | 1/2005 | Hall et al. |
| 6,866,306 B1 | | 3/2005 | Boyle et al. |
| 6,888,473 B1 | | 5/2005 | Hall et al. |

(Continued)

OTHER PUBLICATIONS

PCT/US03/16475, Published Dec. 4, 2003, Applicant Baker Hughes; International Search Report: "Documents Considered to Be Relevant".*

*Primary Examiner*—David Mis
(74) *Attorney, Agent, or Firm*—Jeffery E. Daly

(57) ABSTRACT

A system for setting and adjusting a frequency of electrical output pulses derived from an oscillator in a network is disclosed. The system comprises an accumulator module configured to receive pulses from an oscillator and to output an accumulated value. An adjustor module is configured to store an adjustor value used to correct local oscillator drift. A digital adder adds values from the accumulator module to values stored in the adjustor module and outputs their sums to the accumulator module, where they are stored. The digital adder also outputs an electrical pulse to a logic module. The logic module is in electrical communication with the adjustor module and the network. The logic module may change the value stored in the adjustor module to compensate for local oscillator drift or change the frequency of output pulses. The logic module may also keep time and calculate drift.

28 Claims, 6 Drawing Sheets

U.S. PATENT DOCUMENTS

| | | |
|---|---|---|
| 6,913,093 B1 | 7/2005 | Hall et al. |
| 6,929,493 B1 | 8/2005 | Hall et al. |
| 6,945,802 B1 | 9/2005 | Hall et al. |
| 6,966,611 B1 | 11/2005 | Hall et al. |
| 2004/0039466 A1 | 2/2004 | Lilly et al. |
| 2004/0104797 A1 | 6/2004 | Hall et al. |
| 2004/0113808 A1 | 6/2004 | Hall et al. |
| 2004/0145492 A1 | 7/2004 | Hall et al. |
| 2004/0150532 A1 | 8/2004 | Hall et al. |
| 2004/0164838 A1 | 8/2004 | Hall et al. |
| 2004/0167833 A1 | 8/2004 | Hall et al. |
| 2004/0216847 A1 | 11/2004 | Hall et al. |
| 2004/0244916 A1 | 12/2004 | Hall et al. |
| 2004/0244964 A1 | 12/2004 | Hall et al. |
| 2004/0246142 A1 | 12/2004 | Hall et al. |
| 2005/0001735 A1 | 1/2005 | Hall et al. |
| 2005/0001736 A1 | 1/2005 | Hall et al. |
| 2005/0001738 A1 | 1/2005 | Hall et al. |
| 2005/0035874 A1 | 2/2005 | Hall et al. |
| 2005/0035876 A1 | 2/2005 | Hall et al. |
| 2005/0036507 A1 | 2/2005 | Hall et al. |
| 2005/0036678 A1 | 2/2005 | Hall et al. |
| 2005/0039912 A1 | 2/2005 | Hall et al. |
| 2005/0045339 A1 | 3/2005 | Hall et al. |
| 2005/0046588 A1 | 3/2005 | Hall et al. |
| 2005/0046590 A1 | 3/2005 | Hall et al. |
| 2005/0067159 A1 | 3/2005 | Hall et al. |
| 2005/0070144 A1 | 3/2005 | Hall et al. |
| 2005/0082092 A1 | 4/2005 | Hall et al. |
| 2005/0092499 A1 | 5/2005 | Hall et al. |
| 2005/0093296 A1 | 5/2005 | Hall et al. |
| 2005/0095827 A1 | 5/2005 | Hall et al. |
| 2005/0115717 A1 | 6/2005 | Hall et al. |
| 2005/0145408 A1 | 7/2005 | Hall et al. |
| 2005/0150653 A1 | 7/2005 | Hall et al. |
| 2005/0161215 A1 | 7/2005 | Hall et al. |
| 2005/0173128 A1 | 8/2005 | Hall et al. |
| 2005/0212530 A1 | 9/2005 | Hall et al. |
| 2005/0236160 A1 | 10/2005 | Hall et al. |
| 2005/0279508 A1 | 12/2005 | Hall et al. |
| 2005/0284659 A1 | 12/2005 | Hall et al. |
| 2005/0284662 A1 | 12/2005 | Hall et al. |
| 2005/0284663 A1 | 12/2005 | Hall et al. |
| 2005/0285645 A1 | 12/2005 | Hall et al. |
| 2005/0285705 A1 | 12/2005 | Hall et al. |
| 2005/0285752 A1 | 12/2005 | Hall et al. |
| 2005/0285754 A1 | 12/2005 | Hall et al. |
| 2005/0285761 A1 | 12/2005 | Hall et al. |
| 2005/0287808 A1 | 12/2005 | Hall et al. |

* cited by examiner

SYSTEM FOR ADJUSTING FREQUENCY OF ELECTRICAL OUTPUT PULSES DERIVED FROM AN OSCILLATOR

FEDERAL SPONSORSHIP

This invention was made with government support under Contract No. DE-FC26-01NT41229 awarded by the U.S. Department of Energy. The government has certain rights in the invention.

BACKGROUND OF THE INVENTION

Clocks have been used for centuries as tools for a wide variety of tasks. Generally, clocks rely on some type of device that oscillates at a given frequency known as a clock source or an oscillator. Oscillations from the oscillator may incrementally measure the passage of time. The most common oscillators known in the art are crystal oscillators. A crystal of a substance such as quartz may be cut in such a way that when it is excited by an electric current it oscillates at a given frequency.

In some undertakings, such as downhole seismic measurements, precise time-sensitive measurements are desirable, requiring very accurate clocks. Typically, oscillators are only accurate to a certain level, and are subject to varying degrees of error. In addition, changes in temperature and pressure also affect the frequency of an oscillator and may introduce error into clock measurements. Typically, crystal oscillators are stabilized by controlling the environment in which the crystal is placed Another device which uses the pulses from an oscillator is a baud rate generator. In many situations dealing with network communications, a baud rate generator is required. A baud rate generator relies on regular pulses received from an oscillator in order to produce pulses at a rate at which a network device may read symbols on a line of code or write symbols to a line of code. Generally, baud rate generators are equipped with a prescaler that divides the number of pulses produced by the oscillator by some integer for every pulse emitted by the generator. However, selecting baud rates from a fixed oscillator may be difficult if only integer divisors are allowed. Often in order to change the baud rate, the oscillator must be exchanged for one that has pulses which may be divided by an integer to produce the correct rate. A baud rate generator may also be subject to the effects of oscillator drift.

Several attempts have been made in the art to adjust the frequency of clock or baud rate generator pulses. For instance, U.S. Pat No. 4,868,514 to Azevedo discloses an apparatus and method for digital correction of oscillator drift by providing phase alignment between two clock signals running at nearly the same frequency. Phase alignment is provided by fashioning a delay for one of the clock signals through selection of various lengths of a variable delay path formed from a series of logic circuits.

U.S. Pat No. 4,602,375 to Inukai discloses a method and system for onboard clock correction in a satellite by means of drift prediction. Clock drift is predicted by a polynomial function and corrected by sending a clock correction value to the satellite.

U.S. Pat No. 6,711,230 to Nicholls discloses an apparatus in which an input reference timing signal oscillator of a phase-locked loop has a computer algorithm which adaptively models the multiple frequencies of an oscillator following a training period. The oscillator is part of a phase-locked loop and the oscillation frequency thereof is controlled in response to the phase detector output.

U.S. patent application Ser. No. 10/878,147 to Hall et al. filed on Jun. 28, 2004, and herein incorporated by reference, discloses an apparatus and method for compensating for clock drift wherein a number loaded into a prescaler is adjusted according to clock drift. The apparatus is designed for use in a downhole network with an oscillator whose pulses can be divided by an integer in a prescaler in order to obtain the correct frequency of clock pulses. Using information received over the network, clock drift may be corrected using the apparatus.

BRIEF SUMMARY OF THE INVENTION

The present invention relates to a system and method for setting and adjusting a frequency of electrical output pulses derived from an oscillator. More specifically, it relates to a system and method for adjusting a frequency of electrical output pulses in a clock or a baud rate generator. Even more specifically, it relates to a system and a method for setting and adjusting the frequency of electrical output pulses in clocks and baud rate generators that are connected to a network.

A system for setting and adjusting a frequency of output pulses derived from an oscillator is disclosed in one aspect of the present invention. The system comprises an accumulator module operably connected to an oscillator and a digital adder. The accumulator module is configured to receive electrical pulses from the oscillator, output an accumulated value to the digital adder, and to store a sum received from the digital adder.

The digital adder is configured to add the accumulated value it receives from the accumulator module to an adjustor value received from an adjustor module. The digital adder is also operably connected to a logic module, to which it may output an electrical pulse corresponding to a carry value from its operations. The adjustor module is operably connected to the logic module, and is configured to store and output the adjustor value which is generally constant. The logic module is capable of altering the adjustor value stored and output by the adjustor in order to compensate for oscillator drift or to change the frequency of output pulses. The logic module may be connected to the network and in some embodiments may be further configured to keep time by the electrical output pulses it receives from the adder. It may also calculate oscillator drift over a measured amount of time and undertake the synchronization of its local time to a network global time.

Global time is defined as the time according to a reference time source used by the network. A global time source may be a time-keeping device connected to a network server, a GPS device, a downhole node in the network, or a wireless transmitter. Local time is defined as the time kept according to the logic module.

Also disclosed is a method for producing electrical output pulses at a selected frequency comprising the steps of determining an adjustor value from the selected frequency and receiving electrical pulses from an oscillator. The adjustor value may initially be given by the ratio of the clock's desired output frequency to the frequency of the oscillator. The method further comprises digitally adding an accumulated value to the adjustor value and outputting electrical pulses corresponding to carry values. The stored value may initially be zero. The electrical pulses are output at approximately the selected output frequency.

A method for correcting drift in electrical output pulses derived from an oscillator in a network is also disclosed comprising the steps of receiving electrical pulses from an oscillator, digitally adding an accumulated value to an adjustor value, outputting electrical pulses corresponding to carry values, keeping time based on the electrical output pulses, and modifying the adjustor value to adjust the frequency of electrical output pulses. Local time may be compared with global time through a network connection. The frequency of output pulses may be adjusted in order to compensate for oscillator drift or change the baud rate in a baud rate generator.

DETAILED DESCRIPTION OF THE INVENTION AND THE PREFERRED EMBODIMENT

The following figures, in which like elements are labeled with like numerals, are intended to illustrate certain embodiments of the present invention, and not to limit its scope.

Figure 1:
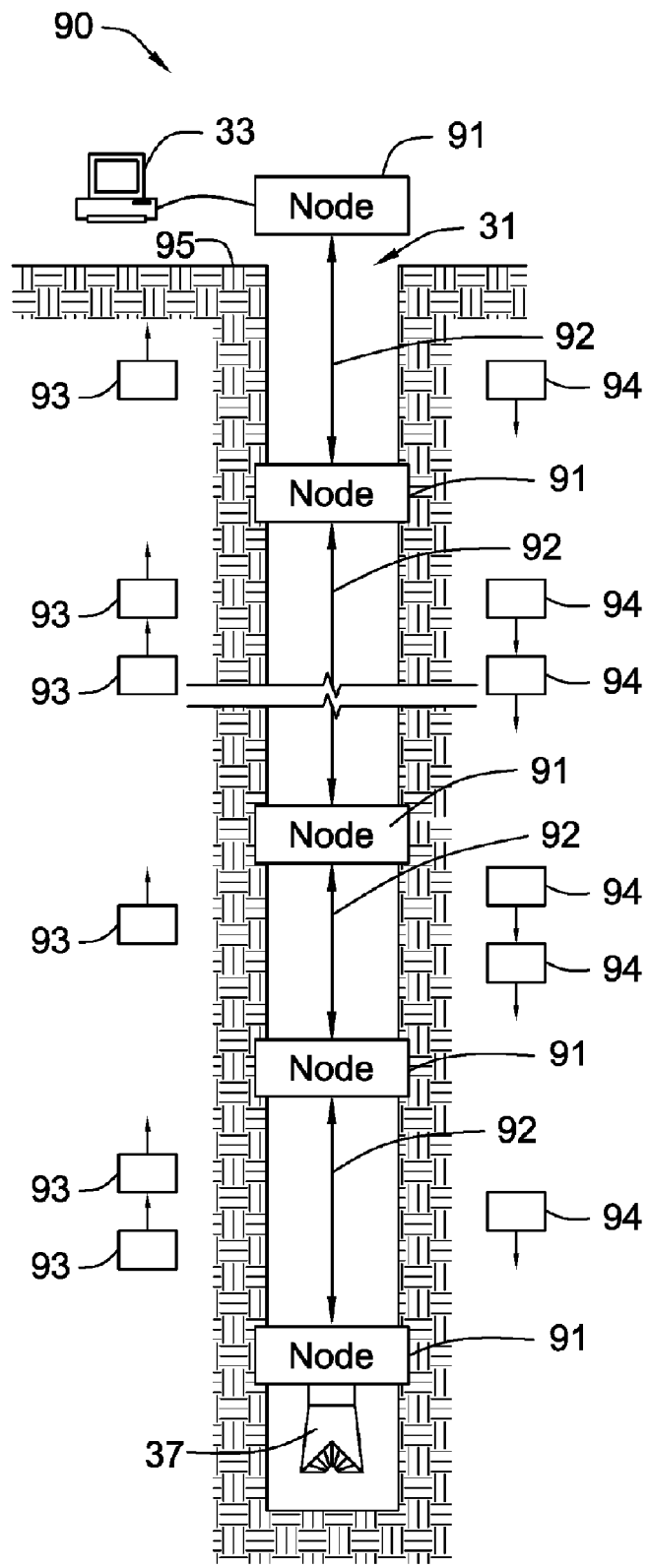
FIG. 1 is a view of one embodiment of a downhole drilling network to which the present invention may be applied.

The present invention is designed to be incorporated into a network 90. While the system may function and be of use in any network 90 that operably connects its components, preferably the network 90 is a downhole network 90 that enables communication between at least two downhole devices. FIG. 1 discloses one embodiment of a downhole network 90 integrated into a downhole tool string 31.

The downhole network 90 comprises a controlling processing element 33 and a plurality of downhole nodes 91 in communication with each other through a downhole data transmission system 92 integrated into downhole components in a downhole tool string 31. The controlling processing element 33 is preferably a computer on the surface 95, but in other embodiments the controlling processing element 33 may be any electronic processor known to the art or an integrated circuit.

Preferably, each of the downhole components in the downhole tool string 31 comprises a communication element in one end connected by an electrical conductor to a communication element in another end, creating a transmission system through which data may travel between various devices and tools in the network 90. One particular implementation employs a downhole data transmission system disclosed more fully in U.S. Pat. No. 6,670,880 to Hall, et al., herein incorporated by reference in its entirety. In other embodiments the communication elements may be optical fiber couplers, acoustic couplers, or even direct electrical contacts. A downhole data transmission system 92 enables the rapid exchange of data between a downhole node 91 and the controlling processing element 33, or between individual downhole nodes 91 in the network 90. Each downhole node 91 or other device in the network 90 may comprise its own processing element. A downhole node 91 may also communicate with one or more downhole tools such as a bottomhole assembly 37.

As in most networks, electronic packets 93, 94 are used to transfer data among the various downhole nodes 91 or other devices connected to the network 90. Packets 94 may be transmitted downhole, and packets 93 may be transmitted uphole. The downhole network 90 may make use of any protocol known in the art to enable communication between the downhole nodes 91 or other devices.

A more specific implementation of the downhole network 90 is more fully discussed in U.S. patent application Ser. No. 10/710,790, entitled "Distributed Downhole Drilling Network," and filed Aug. 3, 2004 in the name of David Hall, et. al.

Figure 2:
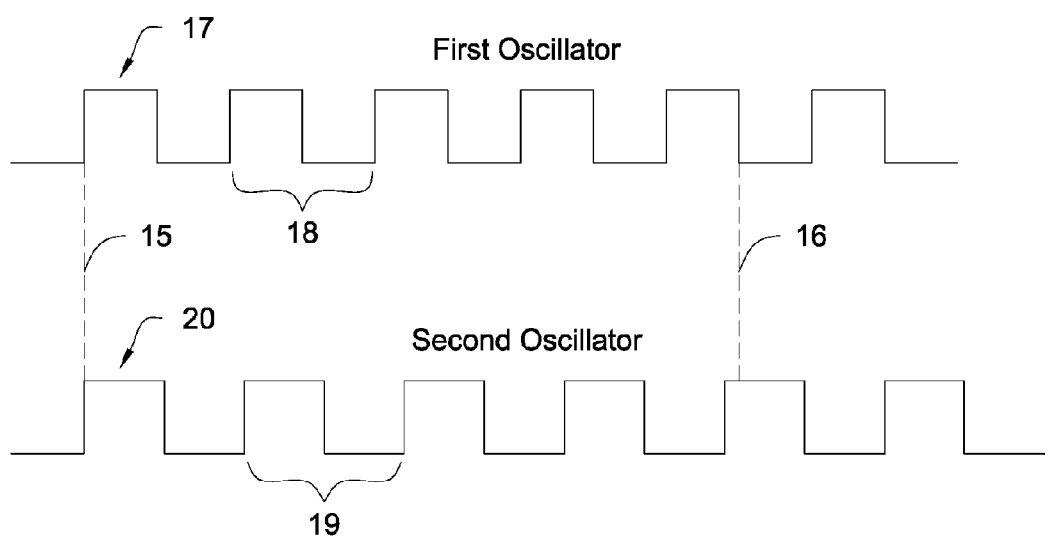
FIG. 2 is a representation of electrical pulses from two oscillators in which a first clock oscillator drifts from a second clock oscillator.

FIG. 2 is a representation of oscillator pulses 17 from a first clock and oscillator pulses 20 from a second clock. For this particular illustration, the oscillators in both the first clock and the second clock are rated at the same frequency. The frequency at which an oscillator is rated may be defined as the number of pulses 17, 20 emitted by the oscillator in a controlled environment in a certain amount of time within a given margin of error. Under certain conditions such as those of a downhole environment, changes in temperature and pressure may affect the frequency at which an oscillator emits pulses.

In FIG. 2, the oscillator in the first clock has developed a drift from the oscillator in the second clock, causing the period 18 of an oscillator cycle in the first clock to be slightly less than the period 19 of an oscillator cycle in the second clock. Although at one moment 15 in time the oscillators are synchronized, at another moment 16 the oscillator in the first clock has completed five pulses and the oscillator in the second clock has not yet completed five pulses, creating a situation of oscillator drift. The present invention provides a way to correct such oscillator drift.

Figure 3:
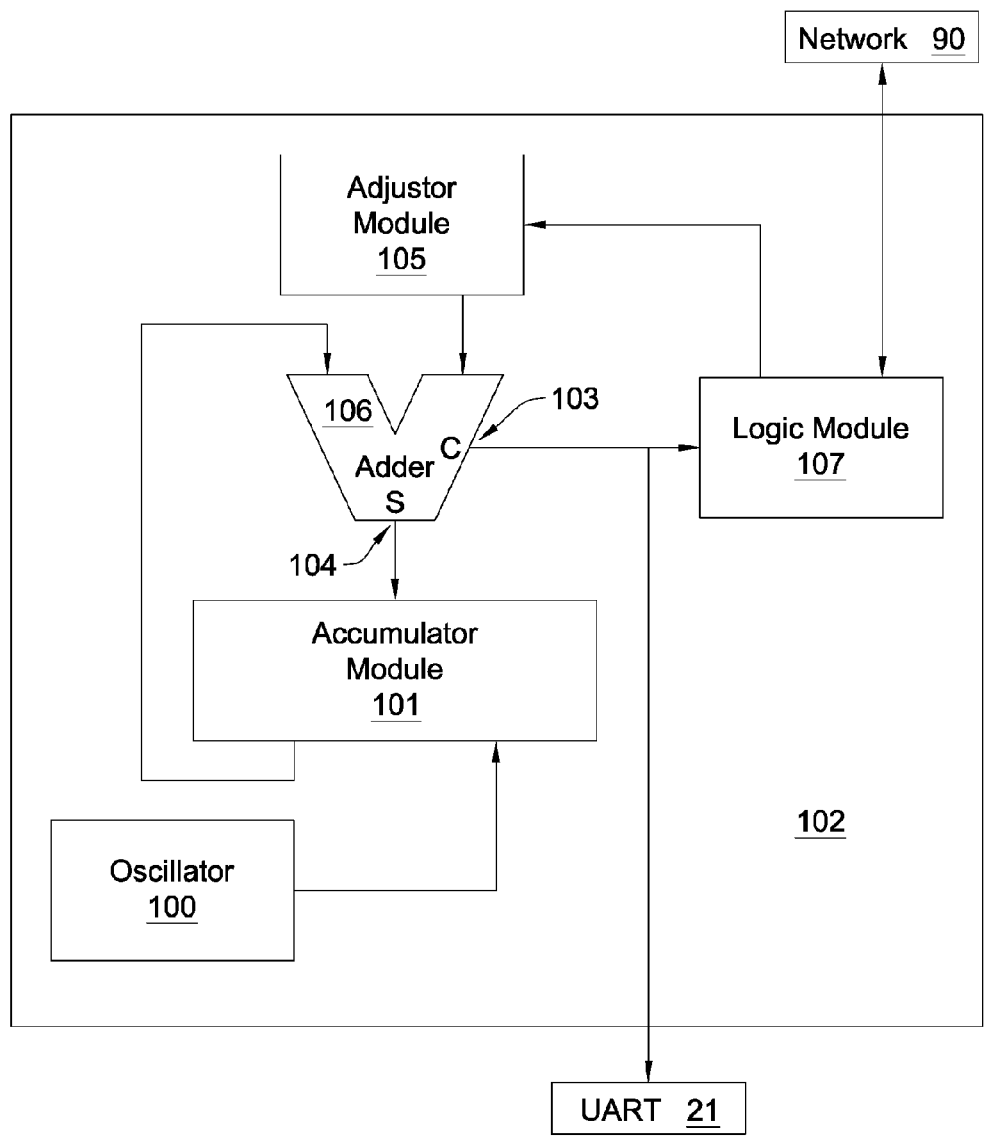
FIG. 3 is a schematic block diagram illustrating one embodiment of an apparatus comprising a system according to the present invention.
Figure 4:
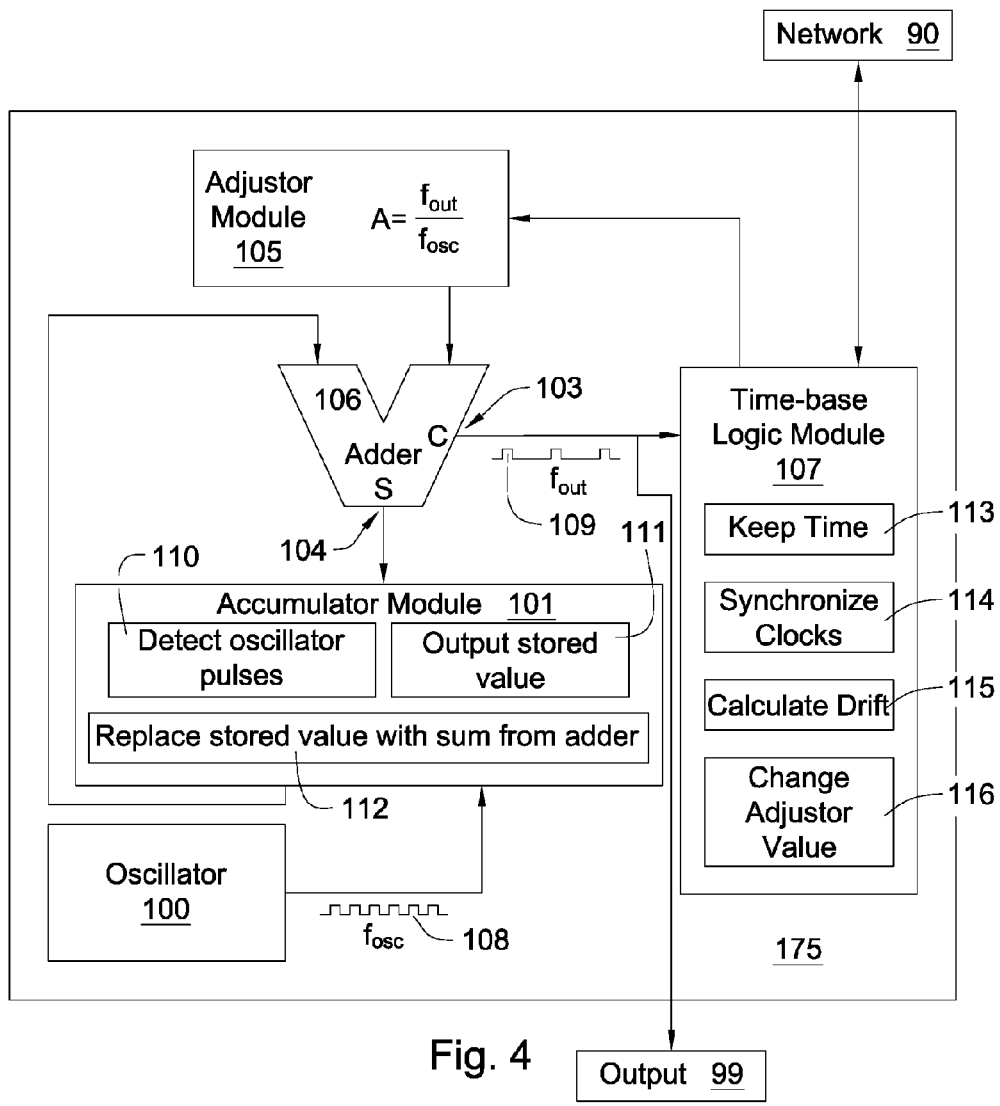
FIG. 4 is a schematic block diagram illustrating a more detailed embodiment of a clock apparatus according to the present invention.

Referring now to FIG. 3, a baud rate generator apparatus 102 in accordance with the present invention is illustrated wherein the apparatus 102 comprises a system for setting or adjusting a frequency of output pulses 109 see FIG. 4) derived from an oscillator 100 in a network 90.

A baud rate generator apparatus 102 may comprise an oscillator 100 configured to output electrical pulses at a certain frequency. Many different oscillators 100 may be configured to operate in this type of apparatus 102. For example, an oscillator 100 may comprise a crystal, a transistor-based circuit, an RC circuit, an LC circuit, or an RLC circuit, all of which are known in the art. All oscillators 100 known in the art have some amount of inherent drift due to natural properties, and this drift may be measured over a period of time. Most oscillators 100 are also affected in some way by changes in temperature or pressure.

The oscillator 100 may be configured to output electrical pulses to an accumulator module 101, to which it is operably connected.

It should be noted that the word module, as used herein, denotes a component of a system that has a specific function and the ability to interface with other components. Generally, a module is a functional unit of electrical components, but in some embodiments, certain modules may be software-based.

Still referring to FIG. 3, the accumulator module 101 is configured to receive pulses from the oscillator 100, output an accumulated value, and store a new accumulated value. The accumulator module 101 is operably connected to a digital adder 106, and may output its stored accumulated value to the adder 106. The accumulator module 101 may also receive a sum value from the digital adder 106 and store it. It should be understood that as used herein, the word value refers to a representation of a numerical quantity.

The digital adder 106 is configured to receive values from the accumulator module 101 and an adjustor module 105 and add them together. Digital adders 106 are well-known in the art, and may have a sum output 104 and a carry output 103. In this particular embodiment of the invention, the sum output 104 of the digital adder 106 is operably connected to the accumulator module 101, and the carry output 103 is operably connected to a logic module 107.

The adjustor module 105 is configured to store an adjustor value and output it to the digital adder 106. In selected embodiments, the adjustor module 105 may be a memory register. The adjustor value may be modified periodically in order to compensate for drift from the oscillator 100 or to change the baud rate frequency.

The logic module 107 is configured to receive an electrical pulse 109 (see FIG. 4) from the digital adder 106 whenever an addition is performed that produces a carry value. The logic module 107 is further configured to change the adjustor value stored in the adjustor module 105. If the apparatus 102 is functioning solely as a baud rate generator, it is not required to keep time based on the electrical pulses 109 (see FIG. 4) received in order to function properly. However, even if the apparatus 102 is functioning primarily as a baud rate generator, the logic module 107 may still be configured to keep time based on the output pulses 109 it receives. This particular characteristic proves useful in calculating and correcting oscillator drift. The logic module 107 may also comprise a connection to the network 90.

A network communications device such as a universal asynchronous receiver/transmitter (UART) 21 may also be connected to the apparatus 102 and configured to receive electric pulses 109 corresponding to carry values from the digital adder 106.

Referring now to FIG. 4, a preferred embodiment of a clock apparatus 175 in accordance with the present invention is shown. In this embodiment, the oscillator 100 is configured to output electrical pulses 108 at a given frequency $f_{osc}$ to the accumulator module 101. The accumulator module 101 is configured to detect 110 oscillator pulses 108, and for each pulse 108 that it detects, the accumulator module 101 is further configured to output 111 a stored accumulated value to the digital adder 106.

In this embodiment of the invention, the adjustor module 105 may initially store an adjustor value A given by the ratio of the desired output pulse frequency $f_{out}$ to the pulse frequency of the oscillator $f_{osc}$. Also in this embodiment of the invention, the accumulator module 101 may be configured to replace 112 its previously stored accumulated value with the sum it receives from the digital adder 106.

If a carry is generated from the addition of the accumulated value to the adjustor value, an electrical output pulse 109 may be transmitted from the carry output 103 of the digital adder 106 to the logic module 107. The logic module 107 is configured to keep time 113 from the pulses 109 it receives and to change 116 the value stored in the adjustor module 105 when needed to compensate for oscillator drift. Time values computed by the logic module 107 may be remotely changed to other values by devices connected to the network 90.

When the apparatus 175 is functioning primarily as a clock, as in the present embodiment, the pulses 109 may be output at a rate corresponding to the normal measurement of time, such as microseconds. Alternately, the apparatus 175 may also function as a baud rate generator, in which case the pulses 109 may be output at a rate consistent with the transmission of data over the network 90. In the present embodiment, the apparatus 175 may be configured to switch functions between that of a time-keeping clock and that of a baud rate generator. For this purpose the apparatus 175 may further comprise an output interface 99, through which output pulses 109 may be received by another device such as a universal asynchronous receiver/transmitter (UART) or another data transmission/reception device.

In this particular embodiment, the logic module 107 is further configured to synchronize 114 the local time value of the clock apparatus 175 with a global time value obtained from the network 90, and to calculate oscillator drift 115. From the calculated oscillator drift, the logic module 107 may further calculate a new adjustor value to store in the adjustor module 105 and a length of time for its storage. Alternately, these calculations may be made by a surface control device 33 or some other device in the network 90. The adjustor value is modified 170 in order to adjust the frequency of output pulses 109. Generally, the frequency of output pulses 109 is adjusted in order to correct oscillator drift. In other embodiments, the frequency of output pulses 109 may be adjusted in according to a predetermined baud rate. If no drift is detected, the time-base module 107 may leave the adjustor value in the adjustor module 105 without altering it.

Figure 5:
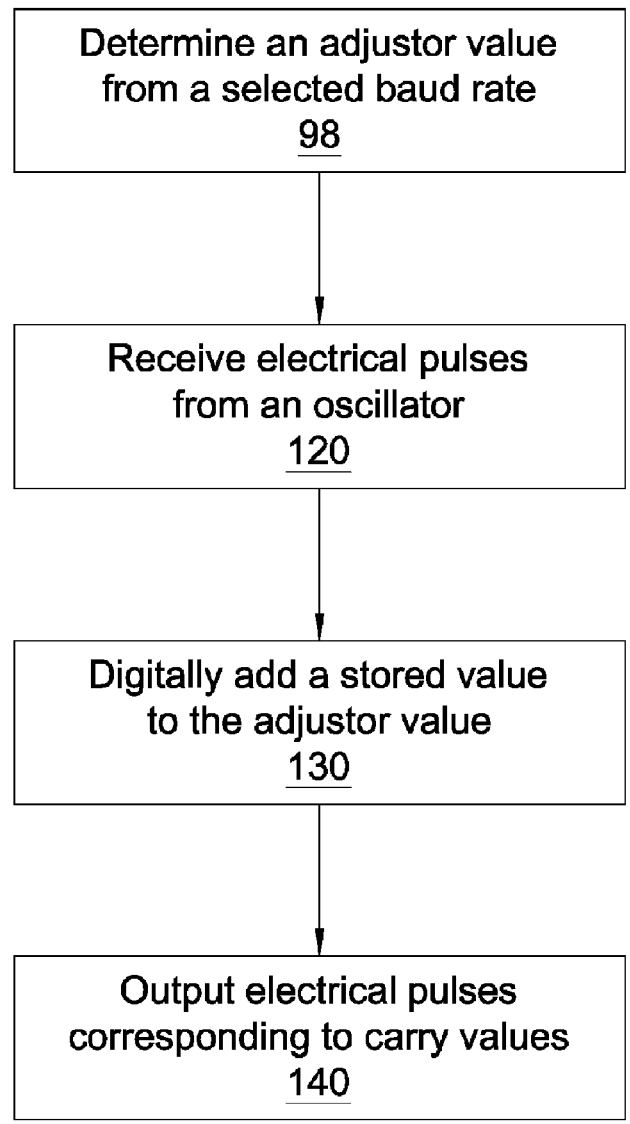
FIG. 5 is a flow chart illustrating one embodiment of a method for producing electrical output pulses at a selected frequency according to the present invention.

Referring now to FIG. 5, one embodiment of a method 117 in accordance with the present invention for producing electrical output pulses 109 at a selected frequency comprises determining 98 an adjustor value from a selected baud rate. The adjustor value may initially be given by dividing the selected frequency of electrical output pulses $f_{out}$ by the pulse frequency of the oscillator 100 $f_{osc}$. The selected frequency $f_{out}$ may be determined by multiplying the selected baud rate by an integer such as 16. Thus, if the selected baud rate were 62.5 khz for data transmission in the network 90, the selected output frequency might be 1 MHz. Furthermore, if the selected output frequency $f_{out}$ were 1 MHz (one microsecond pulses) and the pulse frequency $f_{osc}$ of the oscillator 100 were 16 MHz, then the initial adjustor value could be determined by the formula A=1 MHz/16 MHz=$\frac{1}{16}$=0.0625, wherein A represents the adjustor value. The same value represented in binary notation is 0.0001.

The method 117 also comprises receiving 120 electrical pulses 108 from an oscillator 100. The electrical pulses 108 are preferably received by an accumulator module 101 as described in FIGS. 3–4. The method 117 further comprises digitally adding 130 a stored value to an adjustor value and outputting 140 electrical output pulses 109 corresponding to carry values. Preferably, the step of adding 130 takes place for every electrical pulse 108 received by the accumulator module 101.

To continue with the foregoing example of one embodiment of the method 117, if the value stored in the accumulator module 101 were $\frac{15}{16}$ or 0.11110 in five bit binary notation, then the binary values of 0.11110 and 0.00010 would be added together. Assuming the digital adder 106 to be a five bit digital adder, the sum output to the accumulator module 101 would be 0.00000 with a carry value of 1. The carry value would correspond to an electrical output pulse 109 output to the logic module 107.

When steps 98, 120, 130, 140 are continually repeated, electrical pulses will be output at the approximate determined frequency $f_{out}$.

Figure 6:
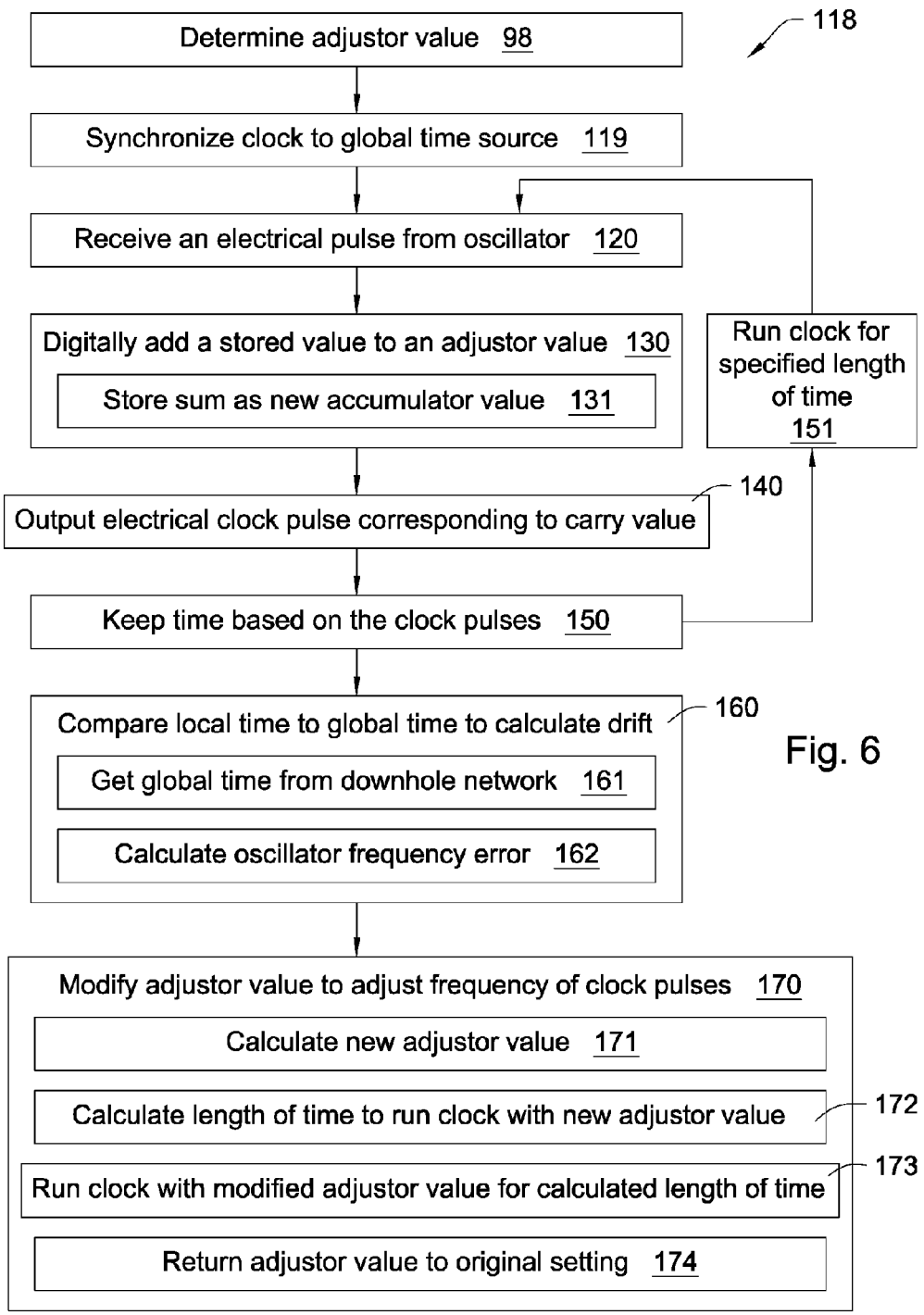
FIG. 6 is a flow chart illustrating one embodiment of a method for correcting oscillator drift according to the present invention.

Referring now to FIG. 6, an embodiment of a method 118 to correct oscillator drift in accordance with the present invention is illustrated. The method 118 may comprise a step of synchronizing 119 local time of a clock to a global time source before other steps are carried out in order to facilitate the calculation of oscillator drift. If the local time and the global time are originally synchronized, drift may be calculated by later comparing the different time readings.

The method 118 comprises the same basic steps 98, 120, 130, 140 as the method 117 illustrated in FIG. 5, in addition to a step of keeping 150 time based on the output pulses 109. Preferably, a logic module 107 (as shown in FIG. 4) comprises logical circuitry that allows it to keep track of the time of day based on the output pulses 109 that it receives. The method 118 may also comprise comparing 160 local time to global time in order to calculate oscillator drift. Information on global time may be retrieved through the network 90. In some embodiments, the information received on global time may be adjusted to compensate for transmission latency from the location of the source of global time to the local clock apparatus 175 (as shown in FIG. 4).

The steps of receiving 120 an electrical pulse from an oscillator 100, digitally adding 130 a stored value to an adjustor value, outputting 140 an electrical output pulse 109 corresponding to a carry value, and keeping 150 time based on the output pulses 109 may be considered for all practical purposes as running a clock. In this embodiment, the step of digitally adding 130 a stored value to an adjustor value may also comprise storing 131 the sum from the addition as a new value in the accumulator module 101. Also, the method 118 further comprises running 151 the clock for a specified length of time before calculating drift. The amount of time that the clock is run 151 may depend on several factors, such as the stability of the oscillator 100, the rate of change of ambient temperature, or the like. The amount of the time that the clock is run 151 may also be specified by some other device over the network 90.

After running 151 the clock for the specified length of time, the step of comparing 160 local time to global time to calculate drift may further comprise getting 161 the global time from a source in the network 90 and calculating 162 oscillator frequency error. In this embodiment, the oscillator frequency error may be calculated 162 by determining the drift of the local time from the global time. This may be expressed as an oscillator drift value in parts per million (ppm). Alternately, output pulse drift may be calculated.

The step of modifying 170 the adjustor value to adjust the frequency of output pulses 109 may also comprise calculating 171 a new adjustor value. This calculation 171 may be performed in the logic module 107 of the clock apparatus 175 or in some other device connected to the network 90. The step 170 may further comprise calculating 172 a length of time to run the clock with the new adjustor value, and running 173 the clock with the modified adjustor value for the calculated length of time. The logic module 107 may modify the adjustor value and count a specified number of output pulses 109 in order to run the clock for the calculated length of time with the calculated adjustor value. The step of modifying 170 the adjustor value may also comprise returning 174 the adjustor value to its original setting after running the clock for the calculated length of time with the calculated adjustor value. In other embodiments, the clock may continue to run indefinitely with the new adjustor value, or the adjustor value may be further modified 170 to more accurately correct the local clock drift.

In a situation similar to that of the example used to illustrate the embodiment of the method 117 in FIG. 5, let it be supposed that a desired output frequency of 1 MHz were selected for a clock (i.e. an output pulse every microsecond). If the value stored in the accumulator module 101 were 0.11110 and it were detected that the oscillator was fast by one pulse, the adjustor value could be modified 170 from 0.00010 to 0.00001. This would cause the values to of 0.11110 and 0.00001 to be added together producing a sum of 0.11111 to be stored in the accumulator module 101 with no output pulse 109 output to the logic module 107, since no carry would be generated by the addition. Upon receiving another pulse from the oscillator 108, the accumulator module 101 could then output its stored value of 0.11111 to be added to the adjustor value of 0.00001, resulting in a sum of 0.00000 output to the accumulator module 101 and a carry value of 1 causing an output pulse 109 to be sent to the logic module. The adjustor value could then be restored to 0.00010 and the oscillator drift would be corrected.

Whereas the present invention has been described in particular relation to the drawings attached hereto, it should be understood that other and further modifications apart from those shown or suggested herein, may be made within the scope and spirit of the present invention.

What is claimed is:

1. A system for setting and adjusting a frequency of output pulses derived from an oscillator in a network comprising:
    an accumulator module configured to receive input pulses from an oscillator and to store an accumulated value;
    an adjustor module configured to store an adjustor value;
    a digital adder configured to add the accumulated value to the adjustor value and to output the sum to the accumulator module, the digital adder further configured to generate output pulses corresponding to carry values of the sum; and
    a logic module configured to receive the output pulses corresponding to the carry values, keep local time based on the output pulses, periodically compare the local time to a global time to calculate drift of the local time relative to the global time, and modify the adjustor value to compensate for the drift.

2. The system of claim 1, wherein the logic module is operably connected to the network.

3. The system of claim 2, wherein the network is a downhole network integrated into a tool string.

4. The system of claim 1, further comprising a source of global time connected to the network.

5. The system of claim 4 wherein the source of global time is selected from the group consisting of network servers, GPS devices, downhole nodes in the network, and wireless transmitters.

6. The system of claim 1, wherein the accumulator module is further configured to output the accumulated value to the digital adder for every input pulse received from the oscillator.

7. The system of claim 1, wherein the sum output to the accumulator module becomes the accumulated value.

8. The system of claim 1, wherein the oscillator is selected from the group consisting of at least one crystal, at least one transistor, at least one RC circuit, at least one LC circuit, and at least one LRC circuit.

9. The system of claim 1, wherein the adjustor module initially stores a value given by a predetermined output pulse frequency divided by the input pulse frequency of the oscillator.

10. The system of claim 1, wherein the digital adder is configured to store a new sum in the accumulator module for each value it receives from the accumulator module.

11. The system of claim 1, wherein the output pulses provide the basis for a baud rate generator for the network.

12. The system of claim 1, wherein the logic module is further configured to periodically synchronize the local time to the global time.

13. A method for generating output pulses at a selected frequency comprising:
    providing an accumulator module configured to receive input pulses from an oscillator and to store an accumulated value;
    providing an adjustor value;
    digitally adding the accumulated value to the adjustor value and storing the sum in the accumulator module;
    generating output pulses corresponding to carry values of the sum;
    keeping local time based on the output pulses;
    periodically comparing the local time to a global time to calculate drift of the local time relative to the global time; and
    modifying the adjustor value to compensate for the drift.

14. The method of claim 13, wherein the step of digitally adding the accumulated value to the adjustor value occurs for each input pulse received from the oscillator.

15. The method of claim 13, wherein the sum stored in the accumulator module becomes the next accumulated value added to the adjustor value.

16. The method of claim 13, wherein the adjustor value is initially determined by dividing a selected output pulse frequency by an input pulse frequency of the oscillator.

17. The method of claim 16, wherein the selected output pulse frequency is a multiple of a desired baud rate for data transmission or reception in a network.

18. The method of claim 17, wherein the selected output pulse frequency is 16 times the desired baud rate for data transmission or reception in a network.

19. A method for correcting drift in output pulses derived from an oscillator in a network comprising:
    determining an adjustor value corresponding to a selected output pulse frequency;
    receiving input pulses from an oscillator;
    digitally adding an accumulated value to the adjustor value to produce a sum;
    generating output pulses corresponding to carry values of the sum;
    keeping local time based on the output pulses; and
    modifying the adjustor value to adjust the frequency of the output pulses.

20. The method of claim 19, wherein the step of digitally adding the accumulated value to the adjustor value occurs for each input pulse received from the oscillator.

21. The method of claim 19, wherein the step of digitally adding the accumulated value to the adjustor value further comprises storing the sum in an accumulator module.

22. The method of claim 21, wherein the sum stored in the accumulator module becomes the next accumulated value added to the adjustor value.

23. The method of claim 19, wherein the adjustor value is initially determined by dividing the selected output pulse frequency by an input pulse frequency of the oscillator.

24. The method of claim 19, further comprising comparing the local time to a global time received over the network to calculate the oscillator drift.

25. The method of claim 24, wherein the steps of receiving input pulses from an oscillator, digitally adding the accumulated value to the adjustor value, generating output pulses corresponding to carry values of the sum, and keeping local time based on the output pulses are repeated at least once before calculating the oscillator drift.

26. The method of claim 24, wherein the global time is adjusted for transmission latency over the network from the source of the global time.

27. The method of claim 24, wherein the local time is compared to the global after synchronizing the local time to the global time.

28. The method of claim 24, wherein modifying the adjustor value further comprises determining a frequency of modification of the adjustor value based on the calculated oscillator drift.

* * * * *